United States Patent [19]
Gaw et al.

[11] Patent Number: 5,256,580
[45] Date of Patent: Oct. 26, 1993

[54] METHOD OF FORMING A LIGHT EMITTING DIODE

[75] Inventors: Craig A. Gaw; Ronald W. Slocumb, both of Scottsdale; Curtis D. Moyer, Phoenix, all of Ariz.

[73] Assignee: Motorola, Inc., Schaumburg, Ill.

[21] Appl. No.: 864,101

[22] Filed: Apr. 6, 1992

[51] Int. Cl.$^5$ .................. H01L 21/20; H01L 21/265
[52] U.S. Cl. ...................... 437/23; 437/129; 437/984; 437/944; 257/14; 372/43
[58] Field of Search ................ 437/126–133, 437/228, 23, 984; 156/643, 644; 257/13–16; 372/43–46; 148/DIG. 141

[56] References Cited

U.S. PATENT DOCUMENTS

| | | | |
|---|---|---|---|
| 4,890,293 | 12/1989 | Tanaya et al. | 372/46 |
| 4,894,840 | 1/1990 | Liau et al. | 372/46 |
| 4,943,540 | 7/1990 | Ren et al. | 437/228 |
| 4,980,317 | 12/1990 | Koblinger et al. | 437/229 |
| 4,989,050 | 1/1991 | Gaw et al. | 257/13 |
| 5,021,361 | 6/1991 | Kimoshita et al. | 437/133 |

FOREIGN PATENT DOCUMENTS 0202964 8/1988 Japan .................... 437/984

2145558 3/1985 United Kingdom ..... 148/DIG. 141

OTHER PUBLICATIONS

Tiburg et al. "A Selective Etching of III-V Compounds with Redox Systems", Journal of Electrochemical Society vol. 123, No. 3 pp. 687–691, May 1976.
Van Dongen "The use of etching techniques in the charactericzation of degraded GaAs-GaAlAs Lasers" J. Electrochemical Soc. 127 (1980), pp. 238–239.

Primary Examiner—Olik Chaudhuri
Assistant Examiner—Ramamohan R. Paladugu
Attorney, Agent, or Firm—Joe E. Barbee; Robert F. Hightower

[57] ABSTRACT

An optical semiconductor device is formed by using one controlled etch to form a "T" shaped contact structure on the device (20). The etch rate is controlled by judicious selection of materials to provide a cladding layer (17) that has a predetermined etch rate in hydrofluoric acid, a support layer (10) and a contact layer (18) that are not affected by hydrofluoric acid, a lift-off layer (19) that is dissolved by hydrofluoric acid, and a barrier layer (21). Dissolving of the lift-off layer (19) facilitates removing the barrier layer (21).

20 Claims, 2 Drawing Sheets

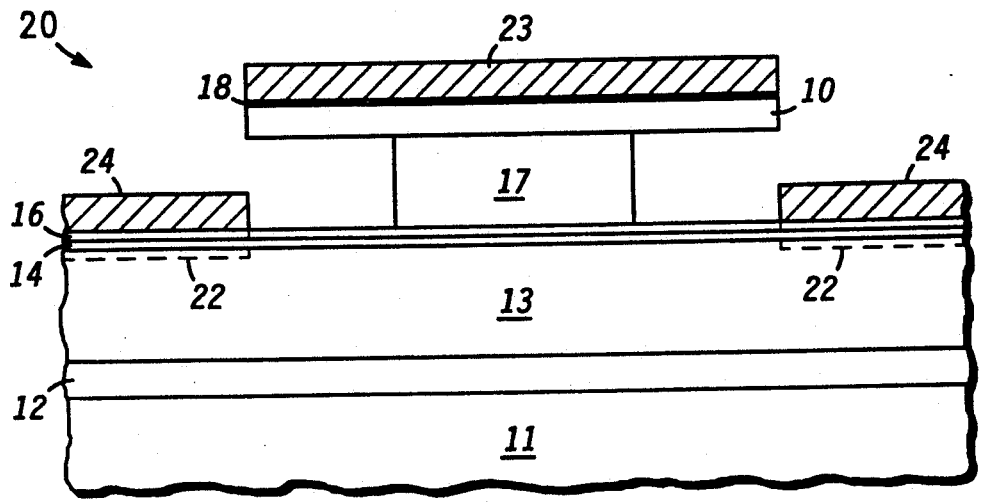
FIG. 3
FIG. 4
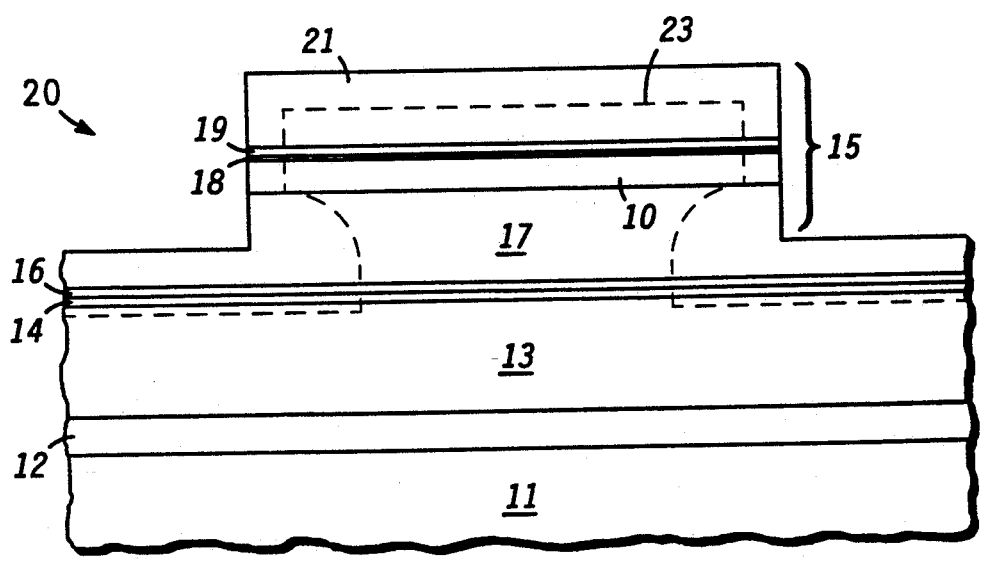

METHOD OF FORMING A LIGHT EMITTING DIODE

BACKGROUND OF THE INVENTION

The present invention relates, in general, to semiconductor devices, and more particularly, to optical semiconductor devices.

In the past, the semiconductor industry has utilized a variety of methods to implement optical semiconductor devices such as light emitting diodes. One previous method included forming multiple layers of semiconductor material on a gallium arsenide substrate and then creating a "T" shaped contact by etching the structure's top most layers. One such light emitting diode is described in U.S. Pat. No. 4,989,050 issued to Gaw et al on Jan. 29, 1991 which is hereby incorporated herein by reference.

One disadvantage with the previous method was inadvertent etching of the sides or edges of the "T" shaped contact's cross member. Generally, electrodes were formed by utilizing the cross member as a mask while depositing conductor material. The etching that affected the cross member's edges, altered the mask size thereby permitting the conductor material to create shorts across the diode's P-N junction and destroying the device.

Another disadvantage of previous methods was the number of processing steps required to form the "T" shaped contact. Generally the "T" shape was obtained by first etching layers off of the cross member. Then three successive etches were used to form the pedestal that supported the cross member thereby completing the "T" shape. These multiple etching operations resulted in a high manufacturing cost for the diode.

Accordingly, it is desirable to have a light emitting diode with a "T" shaped contact having a cross member whose sides or edges are not etched, with a P-N junction that is not shorted, and with a "T" shaped contact that is formed with a minimal number of processing steps.

SUMMARY OF THE INVENTION

Briefly stated, the present invention includes forming an optical semiconductor device by using controlled etch rates to form a "T" shaped contact structure. The etch rate is controlled by judicious selection of materials to provide a cladding layer that has a predetermined etch rate in hydrofluoric acid, a contact layer that is not affected by hydrofluoric acid, and a sacrificial layer that is removed by the hydrofluoric acid. The material selection prevents the sides of the contact layer from being affected by the etch, thus, the resulting "T" shaped contact can be used as a mask to accurately position the diode's electrodes.

BRIEF DESCRIPTION OF THE DRAWINGS

FIG. 3 is the light emitting diode of FIG. 2 further along in the manufacturing process in accordance with the present invention; and FIG. 4 is an alternate LED embodiment in accordance with the present invention.

DETAILED DESCRIPTION OF THE DRAWINGS

Figure 1:
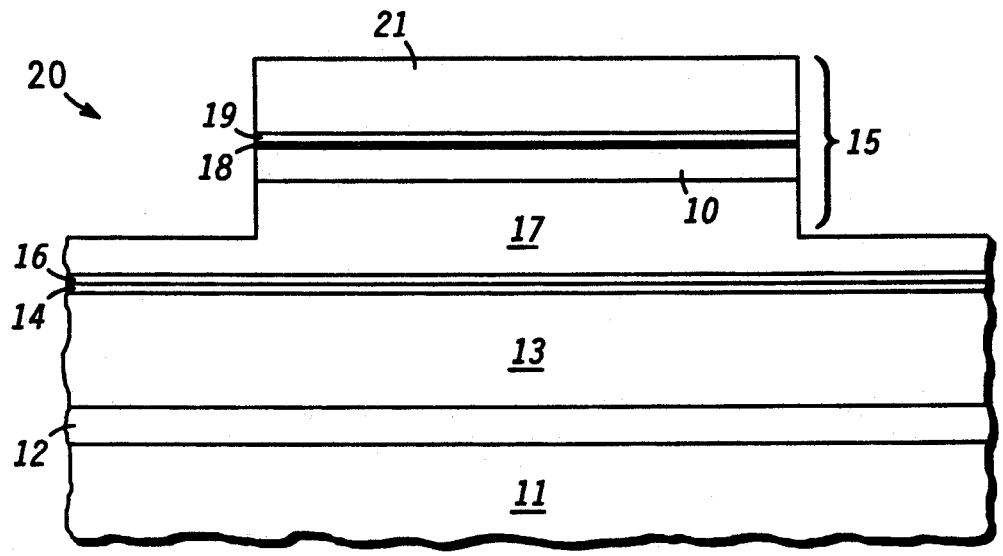
FIG. 1 is an enlarged cross sectional view of a portion of an LED embodiment in a stage of manufacturing in accordance with the present invention.

FIG. 1 illustrates an early stage in the process of forming a light emitting diode 20 from an optical semiconductor wafer. The materials utilized in the optical semiconductor wafer are selected to optimize the structural elements that are created by each processing operation thereby reducing the total number of processing steps required to form diode 20. The optical semiconductor wafer includes a III-V compound semiconductor substrate 11 and a number of III-V compound semiconductor layers which are grown on substrate 11 by well known epitaxial techniques such as metal organic chemical vapor deposition (MOCVD), molecular beam epitaxy (MBE), or other similar methods. An N-type GaAs buffer layer 12 is epitaxially grown on an N-type GaAs substrate 11 to isolate or buffer any impurities that may exist in substrate 11 thereby preventing them from affecting other layers of diode 20. In the preferred embodiment, substrate 11 is approximately 100–250 microns of N-type gallium arsenide (GaAs), and buffer layer 12 is between approximately 0.5 to 2.0 microns of N-type GaAs. P-type aluminum gallium arsenide (AlGaAs) is employed for a cladding layer 13 which covers buffer layer 12. A very thin layer, typically less than 200 angstroms (Å), of P-type indium gallium arsenide (InGaAs) is used for an active layer 14. Indium gallium arsenide's small band gap, combined with the thinness of active layer 14, forms a quantum well that assists in confining carriers within active layer 14 and improves the efficiency of diode 20 by producing light having a wavelength that is long enough to pass through layers 13, 12, and 11.

The remaining layers of diode 20 are chosen not only for the device characteristics the materials can provide, but also for the material's chemical properties. As will be seen hereinafter, aluminum arsenide dissolves very rapidly in certain etchants. Because of this characteristic, the aluminum arsenide molar fraction of each remaining layer of diode 20 is chosen to provide a controlled etch rate that facilitates forming a "T" shaped contact yet doesn't etch the sides of the cross-member. An injection layer 16 covers active layer 14 and provides a source of electrons which are injected into the quantum well of active layer 14. The N-type aluminum gallium arsenide utilized to form injection layer 16 has an aluminum arsenide molar fraction of about eight to eighteen per cent ($Al_{0.08-0.18}Ga_{0.92-0.82}As$) in order to minimize the etch rate of injection layer 16. Injection layer 16 is covered by a cladding layer 17 that is between approximately one and two microns of N-type aluminum gallium arsenide with an aluminum arsenide molar fraction of approximately thirty-two to fifty percent ($Al_{0.32-0.50}Ga_{0.68-0.50}As$) with the preferred content being forty-two percent. Due to the higher aluminum arsenide molar fraction, cladding layer 17 has a higher etch rate than injection layer 16. A GaAs support layer 10 that is between approximately 0.2 and 0.3 microns thick covers cladding layer 17, and supports a contact layer 18. Contact layer 18 is approximately 100 Å of highly doped N-type indium gallium arsenide (InGaAs). Support layer 10 and contact layer 18 function as a single contact layer which has a very slow etch rate since it is devoid of AlAs. An aluminum arsenide (AlAs) lift-off layer 19 has a high aluminum content, thus, a very high etch rate. A GaAs barrier layer 21 covers lift off layer 19 and is used to prevent doping of layer 18 during implanting or diffusion operations. The rapid etching of lift-off layer 19 will subsequently be used as a means of detaching barrier layer 21 from diode 20. In the preferred embodiment, lift-off layer 19 is as thin as approximately 20 Å and as thick as about 1000 Å, but is typically about 500 Å. Lift-off layer 19 and barrier layer 21 function as a sacrificial layer that is sacrificed as a means of forming the desired structure. The aluminum content of layers 16–21 provide controlled etch rates that facilitate forming a "T" shaped contact on diode 20.

At the stage of manufacturing that is illustrated in FIG. 1, a mesa 15 that is approximately 50 to 125 microns wide is formed by applying a mask to the optical semiconductor wafer and removing unprotected portions of the wafer by using a reactive ion etch (RIE), ion mill, or other equivalent etching procedure to provide mesa 15 with vertical sidewalls. The etch removes exposed portions of layer 21, underlying portions of lift off layer 19, contact layer 18, and support layer 10; and etches a predetermined depth into cladding layer 17 thereby creating a sidewall portion of cladding layer 17. In the preferred embodiment, the exposed portions of layer 17 have a thickness that does not impede subsequent implanting of dopants into layers 14 and 16. The exposed sidewalls of cladding layer 17 will subsequently be etched to form a pedestal that supports contact layer 18 and support layer 10.

Figure 2:
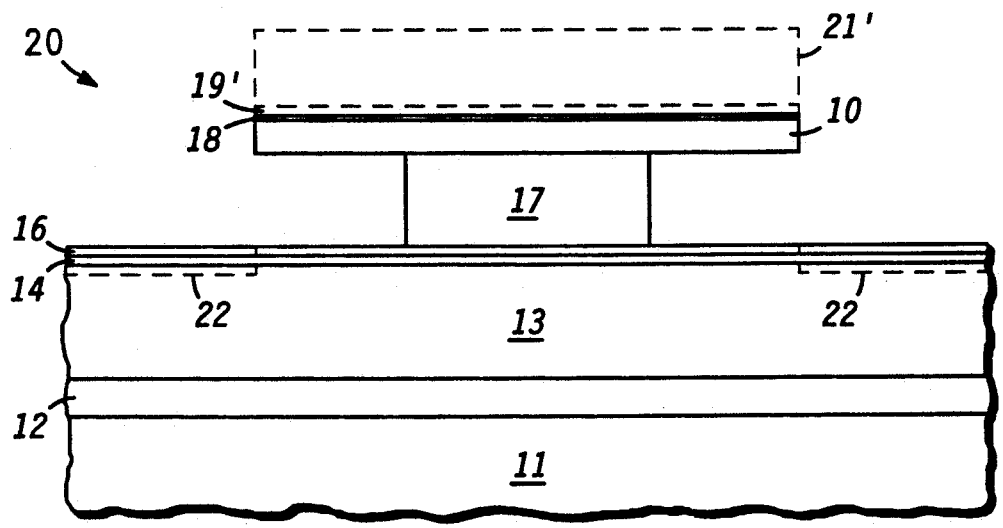
FIG. 2 is the light emitting diode of FIG. 1 at a subsequent manufacturing stage in accordance with the present invention.

FIG. 2 illustrates an embodiment of a subsequent manufacturing stage of diode 20 of FIG. 1. Elements of FIG. 2 that are the same as FIG. 1 have the same reference numerals. Layers 19 and 21 are shown as being removed but are represented by dashed lines 19' and 21' to provide continuity for the explanation of FIG. 2. A P-type dopant, such as beryllium, is implanted into diode 20 to form continuity regions 22, illustrated by dashed lines, that extend into and preferably through active layer 14. The continuity regions facilitate forming a low resistance electrical contact between active layer 14 and metal electrodes that are subsequently formed on the surface of injection layer 16. During the implant operation, barrier layer 21 prevents the P-type dopant from being implanted into contact layer 18. Consequently, the thickness of barrier layer 21 must be greater than the implant depth of the P-type dopant into barrier layer 21. In the preferred embodiment the dopant is implanted to a depth of approximately 0.8 microns. Since an implant is employed to form the continuity regions, the P-type dopant is not deposited into the exposed edges of contact layer 18 and support layer 10 thereby permitting subsequent etch operations to accurately control the shape of the sides of layers 10 and 18

After forming continuity regions 22, barrier layer 21 is no longer needed and can be removed. A hydrofluoric acid (HF) etch is used to simultaneously remove barrier layer 21 and form a "T" shaped structure that supports layer 10. The HF etch dissolves AlAs lift-off layer 19 thereby detaching barrier layer 21, represented by dashed lines 19' and 21', and exposing contact layer 18. HF generally etches P-type AlGaAs rather slowly, however; the implanted dopant does not convert the material to P-type until after the dopant is activated. Prior to the activation, HF provides etching of AlGaAs containing an implanted P-type dopant, the etch rate determined by the AlAs content. Consequently, during the HF etch of lift-off layer 19, cladding layer 17 is also etched but at a slower rate due to the lower aluminum content (about 32 to 50 percent). The aluminum content of cladding layer 17 permits the exposed side walls of cladding layer 17 to be etched thereby undercutting support layer 10 and contact layer 18, and forming a pedestal that supports layers 10 and 18. Support layer 10 and contact layer 18 are devoid of aluminum and not affected by the HF etch. Therefore, the exposed sides of layers 10 and 18 are not altered during the etch operation and the shape of layers 10 and 18 is accurately controlled. Because layers 10 and 18 will subsequently be used as a mask to form self aligned ohmic contact electrodes on the surface of injection layer 16, maintaining the shape is important. Also during the etch procedure, material is removed from the horizontal surface of cladding layer 17, at a rate equivalent to the sidewall removal, until injection layer 16 is exposed. Since injection layer 16 has a low aluminum arsenide molar fraction (approximately 8-18 percent), injection layer 16 is etched at a much slower rate thereby permitting the pedestal to be formed before etching through injection layer 16. It is important that the etch does not go through injection layer 16 in order to prevent surface recombination which could reduce the efficiency of diode 20. Subsequently, the implanted dopants are activated in an arsine over pressure to form P-type continuity regions 22, dashed lines. Such activation methods are well known in the semiconductor art. The single etch operation used to form the "T" shaped contact structure and to simultaneously remove barrier layer 21 is a significant improvement over prior methods that employ multiple etch operations.

Referring to FIG. 3, layers 10 and 18 are utilized as a mask while depositing ohmic contact material to form an electrode 23 on contact layer 18, and a self-aligned electrode 24 on injection layer 16. Electrode 24 surrounds the mesa although it appears as two electrodes due to the cross-sectional illustration.

FIG. 4 illustrates an alternate embodiment of a method of forming diode 20 from the manufacturing stage of FIG. 1. Elements of FIG. 4 that are the same as FIG. 1 have the same reference numerals. A P-type region is formed by diffusing zinc, or other similar mobile dopant such as cadmium, magnesium, etc., into the exposed portions of diode 20 as shown by a dashed line 23. This P-type region will subsequently be used to create electrical connection to P-type InGaAs active layer 14. Since zinc has a higher diffusion rate in AlGaAs than in GaAs and InGaAs, the zinc diffusion front is not uniform as illustrated by the irregular shape of dashed line 23. GaAs barrier layer 21 is used to prevent the zinc dopant from diffusing into N-type InGaAs contact layer 18. Therefore, the thickness of barrier layer 21 must be greater than the distance the zinc dopant diffuses into barrier layer 21. In the preferred embodiment of FIG. 4, barrier layer 21 is approximately one micron thick and the zinc dopant diffuses approximately 0.8 microns into layer 21. After the diffusion is complete, layer 21 is no longer needed and can be removed.

A "T" shaped structure, such as the structure shown in FIG. 3, is formed by employing a two step etch procedure. First, a composition selective P-type etchant that dissolves P-type AlAs, such as a cerium sulfate and cerium nitrate solution, is used to rapidly dissolve the P-type portion of high AlAs content layers 17 and 19. This etch stops on N-type material and etches low Al content material very slowly, thus, the P-type portion of layer 19 is undercut from layer 21 and the P-type region of layer 17 is removed. Then, an HF etch is used to remove the remaining N-type portion of AlAs layer 19 along with a portion of N-type layer 17 thereby detaching barrier layer 21 and undercutting support layer 10. Layer 18 and support layer 10 are not affected by the HF etch, thus, the exposed sides on contact layer 18 and support layer 10 are not altered during the etch operation. It should be noted that a small P-type region remains at each end of layers 10 and 18, after performing the undercut etch. These areas subsequently will be shorted to the N-type areas of each respective layer by electrode 23 (FIG. 3). Consequently, the P-type area of layers 10 and 18 are electrically disabled. After the second etch is complete, P-type continuity regions extend from P-type cladding layer 13 through layer 16 to facilitate forming ohmic connection between electrode 24 (FIG. 3) and active layer 14. Contrary to continuity regions 22 of FIG. 2, these continuity regions extend beneath the cross-member of the "T" structure due to the dopant's diffusion front.

It will be apparent to those skilled in the art that the two step etch procedure explained in FIG. 4 could be applied to the etch procedure described in FIG. 2 if the implanted P-type dopant is activated prior to etching.

In another alternate embodiment, barrier layer 21 is aluminum gallium arsenide with a high aluminum molar fraction, typically greater than fifty percent, that facilitates completely dissolving barrier layer 21 during the HF etch. In this embodiment, lift-off layer 19 is not present. The thickness of barrier layer 21 still must prevent any P-type dopant, from contaminating contact layer 18. Since zinc diffuses two to four times faster into aluminum gallium arsenide than InGaAs or GaAs, barrier layer 21 is typically greater than three microns thick and the zinc diffuses less than three microns into barrier layer 21.

By now it should be appreciated that there has been provided a novel way to fabricate a light emitting diode. In one embodiment, a single HF etch removes barrier layer 21 thereby exposing contact layer 18, the etch also undercuts layers 10 and 18 to form a "T" shaped N-type contact. In an alternate embodiment, the HF etch is preceded by a composition selective P-type etch. The HF etch does not affect the size of support layer 10 or contact layer 18. Therefore, the mask formed by layers 10 and 18 provides accurate placement of the diode's electrodes, and prevents the electrodes from shorting the diode's P-N junction. The material combinations that are utilized for diode 20 minimize the number of etch operations required to form the structure thereby reducing manufacturing costs.

We claim:

1. A method of forming a light emitting diode comprising:
    providing a gallium arsenide (GaAs) substrate;
    covering the substrate with an epitaxial P-type aluminum gallium arsenide (AlGaAs) first cladding layer;
    covering the first cladding layer with an epitaxial P-type indium gallium arsenide (InGaAs) active layer;
    covering the active layer with an epitaxial injection layer that is N-type aluminum gallium arsenide having an aluminum arsenide molar fraction of eight to eighteen percent;
    covering the injection layer with an epitaxial second cladding layer that is N-type aluminum gallium arsenide having an aluminum arsenide molar fraction of thirty-two to fifty percent;
    covering the second cladding layer with an epitaxial N-type gallium arsenide support layer;
    covering the support layer with an epitaxial N-type indium gallium arsenide contact layer;
    covering the contact layer with an epitaxial aluminum arsenide lift-off layer;
    covering the lift-off layer with an epitaxial gallium arsenide barrier layer;
    applying a photo mask covering a portion of the barrier layer;
    etching through the exposed portion of the barrier layer, through underlying portions of the lift-off layer, the contact layer, and the support layer, and a distance into the second cladding layer;
    creating at least one P-type region by forming a P-type dopant in exposed portions of the barrier layer, the second cladding layer, the injection layer, and the active layer;
    forming a "T" shaped contact structure by performing a hydrofluoric acid (HF) etch for dissolving the aluminum arsenide lift-off layer thereby detaching the barrier layer, for removing a portion of the second cladding layer that is covered by the support layer thereby undercutting the support layer, and for removing the portion of the second cladding layer that is not covered by the support layer thereby exposing underlying portions of the injection layer; and
    depositing a conductor material to form an electrode on the contact layer and an electrode on the injection layer wherein the contact layer is utilized as a mask.

2. The method of claim 1 wherein creating at least one P-type region includes implanting a P-type dopant.

3. The method of claim 1 wherein forming the "T" shaped contact structure includes forming the "T" shaped contact structure having a cross member that is approximately fifty to one hundred fifty microns wide and the epitaxial gallium arsenide barrier layer that is approximately one micron thick.

4. The method of claim 1 wherein covering the contact layer with the epitaxial aluminum arsenide lift-off layer includes covering the contact layer with the epitaxial aluminum arsenide lift-off layer having a thickness between approximately twenty and one thousand angstroms.

5. The method of claim 1 wherein the covering the injection layer step includes covering the injection layer with the second cladding layer having a thickness between approximately one and two microns.

6. The method of claim 1 wherein the creating the at least one P-type region includes diffusing a zinc dopant into exposed portions of the barrier layer, the lift-off layer, the contact layer, the support layer, and the second cladding layer.

7. A method of forming an optical semiconductor device comprising:
    providing a III-V compound substrate that is covered with an aluminum gallium arsenide injection layer having an aluminum arsenide molar fraction of a predetermined amount;
    applying an aluminum gallium arsenide cladding layer on the injection layer wherein the cladding layer has an aluminum arsenide molar fraction that is greater than the predetermined amount;

forming a contact layer on the cladding layer wherein the contact layer is a material that is not etched by hydrofluoric acid (HF);

applying a sacrificial layer on the contact layer;

forming the sacrificial layer, the contact layer, and a portion of the cladding layer into a mesa;

positioning a P-type dopant at least in the sacrificial layer and the injection layer; and etching the mesa with hydrofluoric acid (HF) to remove the sacrificial layer and a portion of the cladding layer thereby undercutting the contact layer to form a "T" shape.

8. The method of claim 7 wherein applying the aluminum gallium arsenide cladding layer includes applying the cladding layer having an aluminum arsenide molar fraction of thirty-two to fifty per cent.

9. The method of claim 7 wherein the providing the III-V compound substrate step includes providing the amount that is eight to eighteen per cent.

10. The method of claim 7 wherein applying the sacrificial layer on the contact layer includes applying an aluminum gallium arsenide sacrificial layer.

11. The method of claim 7 wherein etching the mesa with hydrofluoric acid (HF) includes etching the mesa with a cerium sulfate and cerium nitrate solution prior to the etching the mesa with the hydrofluoric acid (HF).

12. The method of claim 7 wherein applying the sacrificial layer includes applying a lift-off layer and covering the lift-off layer with a barrier layer wherein the lift-off layer is a material that is dissolved by hydrofluoric acid (HF).

13. The method of claim 7 wherein creating the P-type region includes implanting a P-type dopant into the sacrificial layer and into the injection layer.

14. A method of making an optical semiconductor device comprising:

providing a III-V compound substrate having an injection layer on the substrate, a cladding layer on the injection layer, a contact layer on the cladding layer wherein the contact layer is a material that is not etched by hydrofluoric acid (HF), and a sacrificial layer on the contact layer;

removing exposed portions of the sacrificial layer, underlying portions of the contact layer, and an amount of the cladding layer;

doping exposed portions of the optical semiconductor device with a P-type dopant; and removing the sacrificial layer by etching the sacrificial layer while simultaneously etching exposed portions of the cladding layer thereby forming a "T" shaped structure wherein the contact layer forms a cross member of the "T" structure and the cladding layer forms a pedestal supporting the cross member.

15. The method of claim 14 wherein removing the sacrificial layer includes removing an aluminum gallium arsenide sacrificial layer having an aluminum content of at least fifty percent which facilitates etching the sacrificial layer at a faster rate than the cladding layer.

16. The method of claim 15 wherein removing the sacrificial layer includes removing the sacrificial layer that is approximately two to four microns thick.

17. The method of claim 14 wherein the providing the III-V compound substrate step includes providing the cladding layer that is aluminum gallium arsenide having an aluminum arsenide molar fraction of thirty-two to fifty percent.

18. The method of claim 14 wherein removing the sacrificial layer includes removing a two layer sacrificial layer that is composed of a layer of aluminum arsenide covered with a layer of gallium arsenide wherein the aluminum arsenide layer is dissolved thereby detaching the gallium arsenide layer and lifting the gallium arsenide layer off the optical semiconductor device.

19. The method of claim 14 wherein the removing the sacrificial layer step includes etching with a solution of cerium sulfate and cerium nitrate, followed by etching with hydrofluoric (HF) acid.

20. The method of claim 14 wherein doping exposed portions includes ion implanting with a dopant selected from the group consisting of beryllium, zinc, cadimum, and magnesium.

* * * * *